(12) United States Patent
Uchida

(10) Patent No.: US 7,362,013 B2
(45) Date of Patent: Apr. 22, 2008

(54) LINEAR MOTOR, EXPOSURE APPARATUS USING THE SAME, AND DEVICE MANUFACTURING METHOD

(75) Inventor: Shinji Uchida, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 308 days.

(21) Appl. No.: 10/987,028

(22) Filed: Nov. 15, 2004

(65) Prior Publication Data
US 2005/0134122 A1    Jun. 23, 2005

(30) Foreign Application Priority Data
Nov. 18, 2003   (JP)   ............... 2003-388507

(51) Int. Cl.
*H02K 41/00* (2006.01)
*H02K 1/00* (2006.01)

(52) U.S. Cl. ............... 310/12; 310/216; 29/596

(58) Field of Classification Search ............ 310/12–14, 310/216
See application file for complete search history.

(56) References Cited

U.S. PATENT DOCUMENTS

| | | | | |
|---|---|---|---|---|
| 4,581,553 A | * | 4/1986 | Moczala | 310/12 |
| 4,933,584 A | * | 6/1990 | Harms et al. | 310/162 |
| 5,218,250 A | * | 6/1993 | Nakagawa | 310/12 |
| 5,302,872 A | * | 4/1994 | Ohki et al. | 310/12 |
| 5,818,187 A | * | 10/1998 | Savage et al. | 318/443 |
| 6,104,117 A | * | 8/2000 | Nakamura et al. | 310/254 |
| 6,323,935 B1 | * | 11/2001 | Ebihara et al. | 310/12 |
| 6,329,728 B1 | * | 12/2001 | Kitazawa et al. | 310/14 |
| 6,791,214 B2 | * | 9/2004 | Korenaga | 310/12 |
| 6,853,099 B2 | | 2/2005 | Uchida | 310/12 |

FOREIGN PATENT DOCUMENTS

| | | |
|---|---|---|
| EP | 1322027 A1 * | 6/2003 |
| JP | 2-246761 | 10/1990 |
| JP | 11-308850 | 11/1999 |

\* cited by examiner

*Primary Examiner*—Tran Nguyen
(74) *Attorney, Agent, or Firm*—Fitzpatrick, Cella, Harper & Scinto

(57) ABSTRACT

In a movable magnet-type linear motor including a stator having a plurality of iron core elements arranged at a certain slot pitch and a movable part having a magnet 3 which is movable in an arrangement direction one or more pseudo-slots are provided between adjacent slots, and the iron core element and the magnet are relatively skewed by an approximately apparent slot pitch including the pseudo-slot.

8 Claims, 20 Drawing Sheets

(a)

(b)

(a)

(b)

(a)

(b)

(a)

(b)

(a)

(b)

LINEAR MOTOR, EXPOSURE APPARATUS USING THE SAME, AND DEVICE MANUFACTURING METHOD

FIELD OF THE INVENTION AND RELATED ART

The present invention relates to a linear motor, particularly a linear motor for use in a precision drive apparatus such as a machine tool or a semiconductor manufacturing apparatus.

A linear motor has been frequently used in a precision drive apparatus such as a machine tool or a semiconductor manufacturing apparatus. The machine tool or the semiconductor manufacturing apparatus is required to satisfy a drive accuracy, a large thrust for improving productivity, and a light weight mover(movable part).

FIG. 23 shows a conventional linear motor disclosed in Japanese Laid-Open Patent Application (JP-A) No. Hei 11-308850. An armature iron core is disposed on a base and a coil is fixedly wound around the armature core to form a stator of the linear motor. A magnet array comprising a plurality of magnets disposed in a drive axis direction so as to be opposite to an upper surface of the stator via a gap and a connecting member for integrally connecting the magnet train are provided, thus constituting a mover(movable part). The movable part is fixed on a stage (not shown) which is guided by a guide (not shown), and the stage is driven in the drive axis direction. By providing the coil with the iron core, a large thrust is obtained.

Further, the movable part comprises a magnet unit to be reduced in weight. This is because a weight of the movable part is increased when the coil is increased in size to increase ampere-turn in the case where the movable part comprises a coil unit but is not changed at all even when the coil is increased in size to increase ampere-turn in the case where the movable part comprises the magnet unit.

As a problem of the linear motor having the iron-core, there is so-called cogging due to an attractive force between the magnet and the iron core. The cogging is a disturbance which occurs irrespective of the presence or absence of a current and deteriorates a positional accuracy of the apparatus. Further, an additional current is required for driving, thus increasing heat generation.

As a means for reducing the cogging, a method of canceling apparent cogging by providing a movable magnet with a commutating pole or a method of shifting respective phases of a plurality of units of linear motor has been proposed. However, after all, these methods merely can remove a certain frequency component of the cogging. Further, as described in JP-A No. Hei 2-246761, a method in which a skew angle is provided to an armature iron core or a magnet has also been proposed but can also merely remove a certain frequency component of the cogging. Further, the skew causes a lowering in magnetic flux interlinking the coil to lower a generation efficiency of thrust with respect to an input current, thus increasing heat generation.

SUMMARY OF THE INVENTION

The present invention has accomplished in view of the above described problems.

An object of the present invention is to provide a movable magnet-type linear motor, having an iron core, capable of substantially reducing cogging to zero to improve a heat generation characteristic.

According to an aspect of the present invention, there is provided a linear motor, comprising:

a stator having a plurality of iron core elements arranged at a certain slot pitch, and a mover(movable part) having a magnet which is movable in an arrangement direction of the iron core elements, wherein the stator has a pseudo-slot between adjacent slots and relatively skews the iron core elements and the magnet by an apparent slot pitch including the pseudo-slot.

The pseudo-slot is, e.g., one formed by a change in magnetic resistance (reluctance) in the above described arrangement direction at an end surface of the iron core element facing the magnet or a groove disposed in parallel with the slot at an end surface of the iron core element facing the magnet.

In the present invention, the "apparent slot pitch" is a value obtained by dividing the slot pitch by (the number of pseudo-slots+1). Further, a term "approximately apparent slot pitch" means, in the case where a plurality of pseudo-slots are provided, the apparent slot pitch, a distance between centers of adjacent pseudo-slots, or a distance between a center of a slot and a center of its adjacent pseudo-slot. In the present invention, the terms "pitch", "distance", "parallel", "perpendicular direction", etc. include all equivalents to the terms considered within common knowledge, such as those within ordinary manufacturing errors.

According to the present invention, a pseudo-slot is provided between respective adjacent slots to shorten the apparent slot pitch, i.e., a cogging period, and the magnet and the iron core element are skewed substantially by the cogging period. By doing so, the cogging becomes zero in the movable magnet-type linear motor having the iron core and it is possible to provide a linear motor improved in heat generation characteristic.

A first linear motor according to a preferred embodiment of the present invention is a movable magnet-type linear motor having iron core elements, disposed in parallel with each other at a certain pitch, as a stator, characterized in that a magnetic resistance is changed along a moving direction at an end surface of iron core element facing a magnet and both ends of magnet are shifted by a spacing of pitch of the change in magnetic resistance in the moving direction.

A second linear motor according to a preferred embodiment of the present invention is a movable magnet-type linear motor having iron core elements, disposed in parallel with each other at a certain pitch, as a stator, characterized in that a groove is provided along a moving direction at an end surface of iron core element facing a magnet and both ends of magnet are shifted by a spacing of the apparent slot pitch in the moving direction.

The second linear motor, e.g., has one groove at a central position in the moving direction at an iron more element end surface and a length of the groove is shorter than a length of slot in the moving direction.

Alternatively, the linear motor has a plurality of grooves in the moving direction at the iron core element end surfaces and the position of groove is slightly shifted from the spacing of apparent slot pitch. In the case where two grooves are provided at an iron core element end surface, a pitch (spacing) between the two grooves may preferably be longer than the apparent slot pitch and a length of groove may preferably be shorter than a length of slot in the moving direction.

DETAILED DESCRIPTION OF THE PREFERRED EMBODIMENTS

Hereinbelow, preferred embodiments of the present invention will be described with reference to the drawings.

First Embodiment

Figure 1:
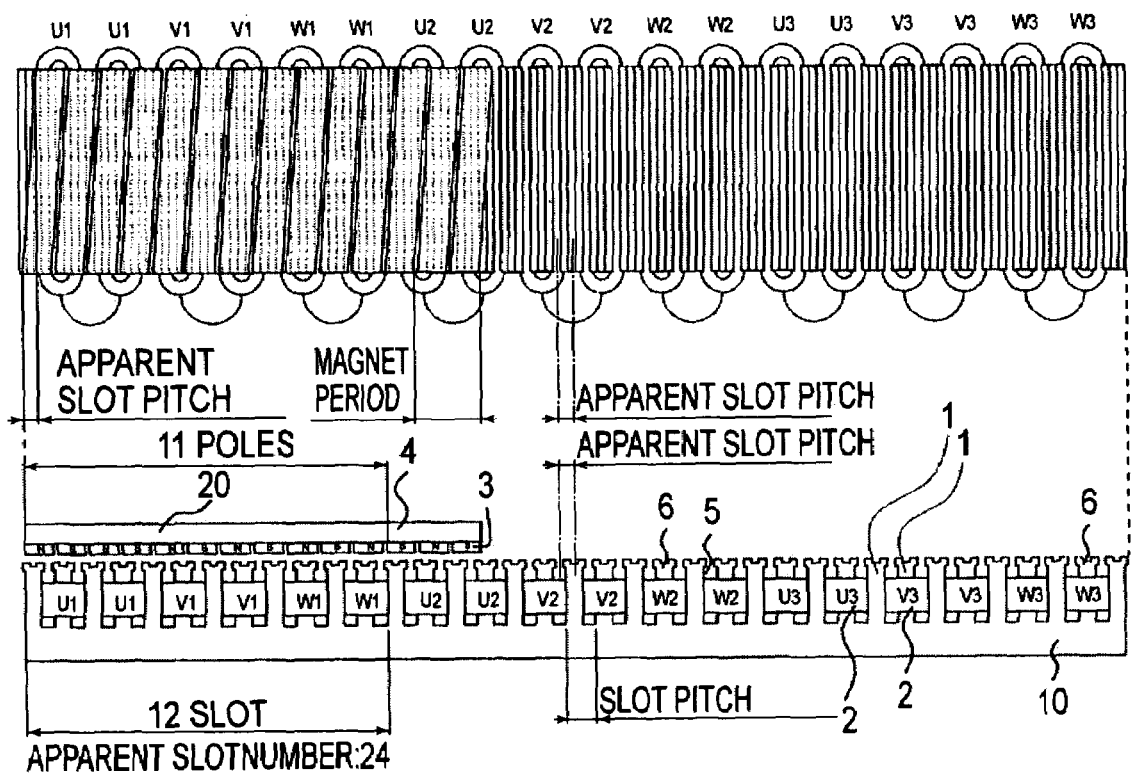
FIG. 1 is a view showing a structure of a linear motor according to a First Embodiment of the present invention.

FIG. 1 shows a structure of a movable magnet-type linear motor according to this embodiment of the present invention.

In the linear motor shown in FIG. 1, a plurality of iron core elements 1 and disposed on an unshown base in parallel with each other at a certain spacing, and each coil 2 is wound about an associated iron core element 1 to form an armature (iron) core. There armature cores are integrally connected together to form a stator 10 of the linear motor. A magnet array (magnet train) comprising a plurality of magnets 3 arranged in a drive axis direction so as to face an upper surface of the stator 10 via a gap and a back-yoke 4 for circulating magnetic flux of the magnet array are disposed to constitute a linear motor movable part 20. The linear motor movable part is fixed on an unshown stage which is guided by an unshown guide and is driven in the drive axis direction. By using the coil having the iron core, a large thrust can be ensured.

Further, the movable part 20 comprises the magnet unit, whereby the movable part can be reduced in weight. This is because the weight of the movable part is increased when the coil is increased in size to provide a large ampere-turn in the case where the movable part is constituted by a coil unit but is not changed even when the oil is increased in size to provide a larger ampere-turn in the case where the movable part is constituted by the magnet unit.

With respect to a dimension in-the drive (axis) direction in this embodiment, a dimension of 11 movable magnets equals to a dimension of 12 slots (each comprising a stator core tooth 1 and a slot 5), and the stator core teeth 1 and 2 slots 5 constitute one unit having 3 phase structure. Accordingly, the linear motor has a so-called 11 pole-12 slot structure. Herein, a space between adjacent iron core elements arranged at a certain pitch (spacing) with respect to the stator 10 is referred to as the "slot". The slot is a space for winding the coil about the armature core. A pitch of slot is referred to as the "slot pitch (slot spacing)".

The stator coil has a 3-phase structure of UVW. Adjacent two coils are connected with each other in series or in parallel to constitute of one phase, e.g., U phase, of the three phases UVW.

In this embodiment shown in FIG. 1, the number of slots is 36 and one coil is wounded by use of two slots. Adjacent two coils are connected in series or in parallel to provide three sets of 3-phase units (UVW) comprising, e.g., different three U phases of U1, U2 and U3. These U phase units (U1, U2, U3) have electrical angles which are identical or opposite in phase to each other. These units are only energized when they face to magnets but are not energized at the same time. Further, the coil units are used by switching with movement of magnet. These are true for the V phase coils and W phase oils.

On the other hand, the movable magnets comprises 14 poles, of which 11 poles principally attribute to the thrust and remaining 3 poles are present in order to effect transfer at the time of switching of coils.

Figure 2:
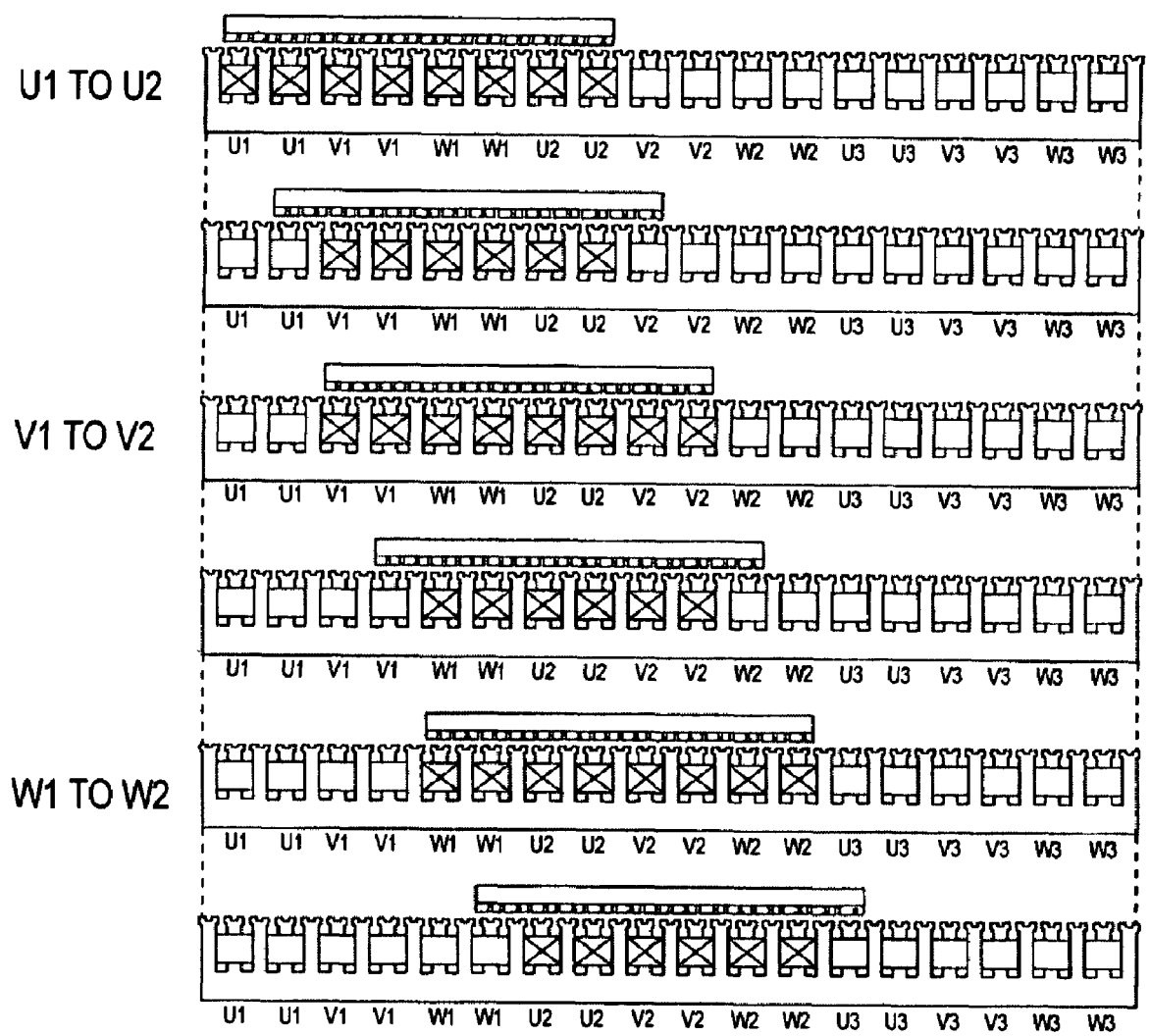
FIG. 2 includes views showing a relationship between a position of movable part and a current-carrying coil in the linear motor shown in FIG. 1.

FIG. 2 shows a relationship between a position of movable magnet and coils to be energized. In FIG. 2, the coils to be energized are indicated by the "x" marks in rectangles. Basically, the coils for the same phase are not energized simultaneously but in FIG. 1, the coils for 4 phases are placed in an energized state at some positions at the same time. These positions are coil switching position where a current of the coils to be switched is zero. In other words, the coils for the same phase are switched in zero-current state.

The current is controlled by an ordinary sine-wave drive so that magnetic flux vector and current vector are perpendicular to each other. As described above, the sine-wave drive and the coil switching are performed simultaneously to produce thrust. The U phase units U1, U2 and U3 are identical or opposite in phase to each other as described above. In this embodiment, more specifically, U1 and U3 have the same phase, and U2 has the opposite phase. This is attributable to the 11 pole-12 slot structure and the number of poles in pole-slot representation, being an odd number. More specifically, one pole corresponds to an electrical angle of 180 degrees, so that when the number of poles is an odd number in pole-slot representation, a certain 3 phase unit and a subsequent 3 phase unit provide an opposite phase relationship.

Next, the structure of iron core elements of the stator in the linear motor shown in FIGS. 1 and 2 will be described.

Each of the iron core elements 1 arranged in parallel at a certain spacing is provided with a groove 6 disposed at its end surface facing the magnet array of the movable part so that the groove 6 is perpendicular to the moving direction of the movable part. By doing so, it is possible to reduce a period of cogging as a feature of the linear motor according to the present invention. In this embodiment, one groove 6 is provided at a central portion of an end surface of one iron core element 1.

In an actual linear motor, the number of grooves 6 provided at the end surface of iron core element may appropriately determined but the positions of the grooves are determined such that a spacing between adjacent slot and groove is approximately equal to a spacing between adjacent grooves. Herein, a pitch of adjacent slot and groove of the plurality of slots and grooves arranged at an appropriately identical spacing is referred to as the "apparent slot pitch (slot spacing)". In order to provide a space in which a groove is formed at the iron core element end surface, the dimension of the iron core element in the moving direction is determined such that a portion of the end surface where the groove is provided is longer than a portion where the coil is wound.

By providing such a structure, when the iron core elements of the stator 10 are viewed from the magnet array of the movable part 20, the number of the apparent slots is made to appear to be larger than the number of actual slots. In this embodiment, with respect to 11 poles of the magnets of the movable part, the number of apparent slots of the stator is 24. Ordinarily, different from a rotation-type motor in the movable magnet-type linear motor, the movable part has a formed end and a rear end in the moving direction, so that cogging occurs as a periodic function including a high frequency wave have a slot pitch as a period by the effect of these ends when the movable part is moved.

Figure 3:
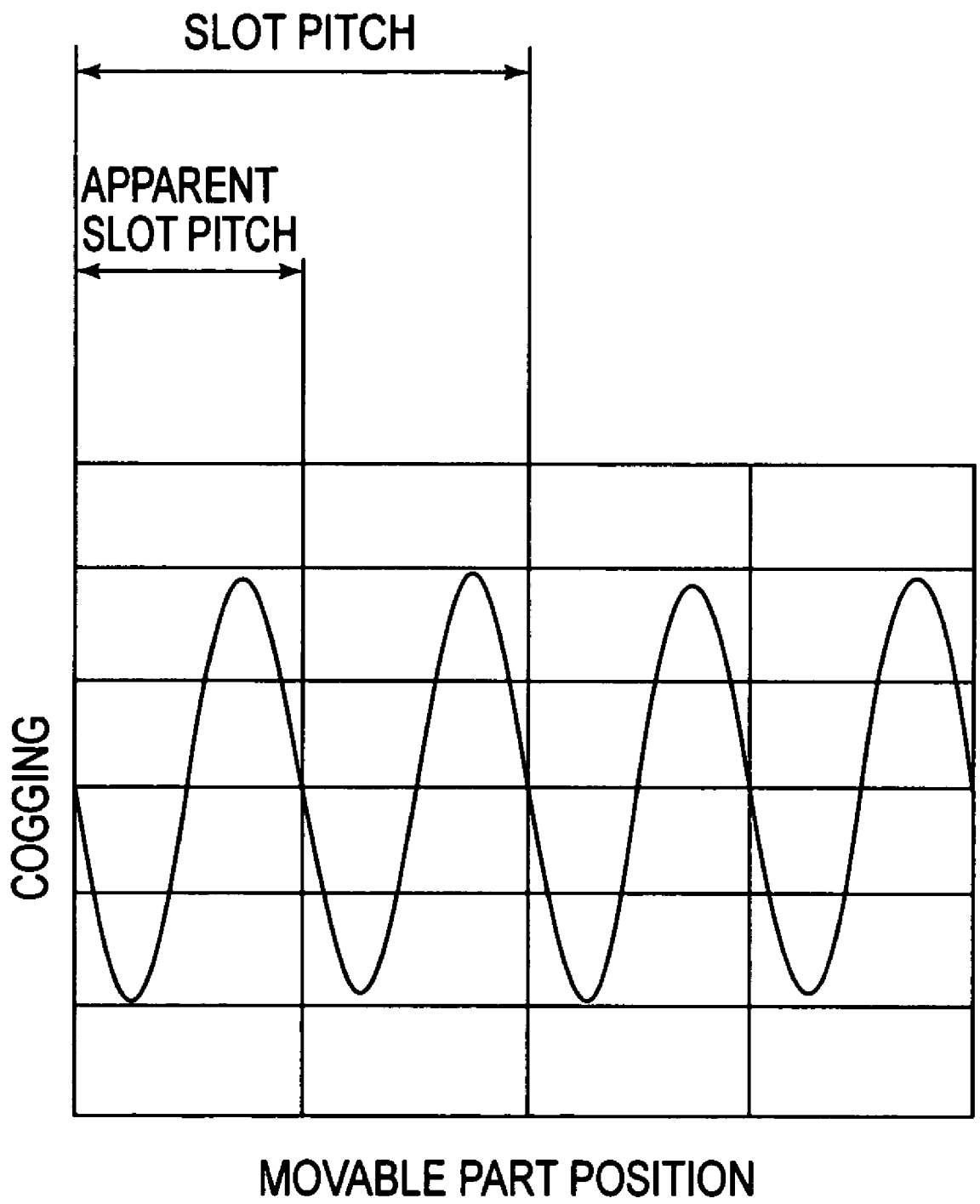
FIG. 3 is a view for illustrating cogging in the linear motor shown in FIG. 1.

FIG. 3 shows a relationship between a position of movable part and cogging. For comparison, FIG. 4(a) shows a cogging waveform of a movable magnet-type linear motor with no groove at an iron core element end surface and FIG. 4(b) shows a structure of the linear motor.

The cogging waveform in the case where no groove is provided is a periodic function having a slot pitch as a period. On the other hand, the cogging were form in the case where the groove is provided is a periodic function having an approximately apparent slot pitch as a period.

Figure 5:
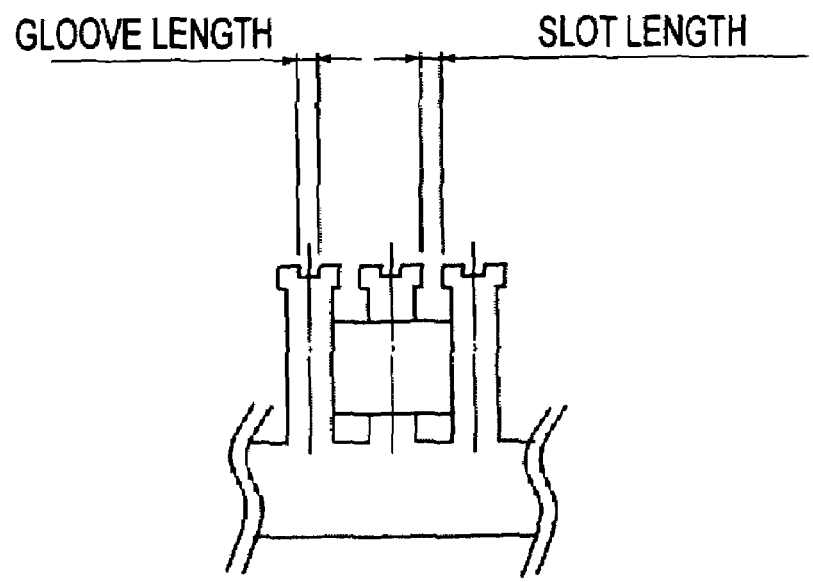
FIG. 5 is an explanatory view for a shape of an armature (iron) core in the linear motor shown in FIG. 1.

By providing the groove at the iron core element end surface, it is possible to decrease the period of the cogging waveform to the approximately apparent pitch. However, in order to actually equalize the cogging waveform period with the apparent slot pitch, it is necessary to effect fine adjustment of the slot length and the groove length as shown in FIG. 5. This is because a magnitude of permeance from the slot to the magnet is different from a magnitude of permeance from the groove to the magnet. Accordingly, it is necessary to equalize both of the permeances with each other in order to equalize the cogging waveform period with the apparent slot pitch. In this embodiment, the slot length and the groove length in the drive (moving) direction of the movable part are not equal to each other.

Figure 6:
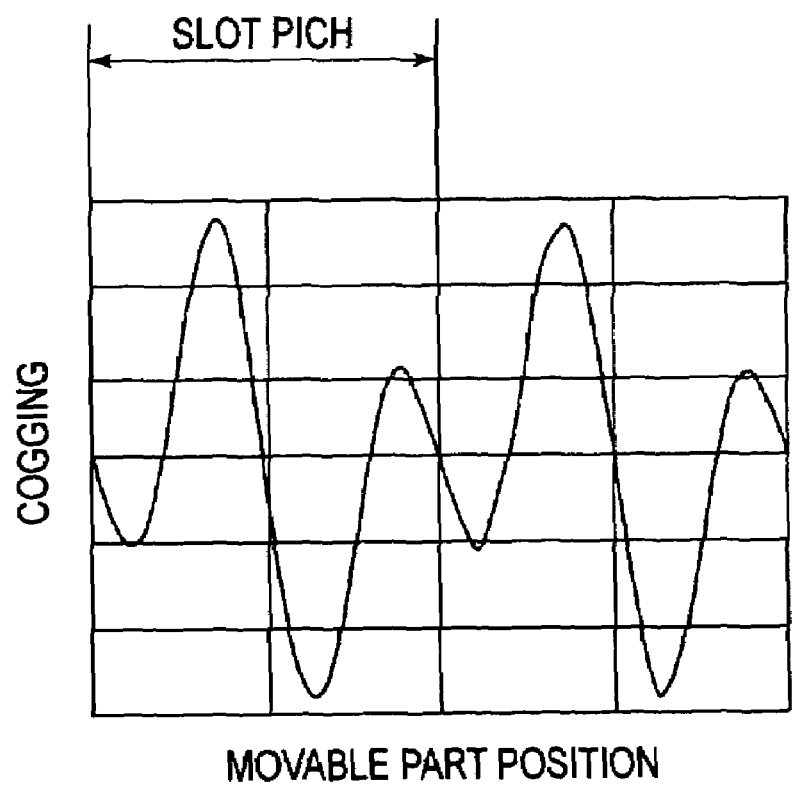
FIG. 6 is a view for illustrating cogging in the case where a groove length and a slot length are equal to each other in the linear motor shown in FIG. 1.

For comparison, FIG. 6 shows a cogging waveform in the case where the slot length equals to the groove length. As shown in FIG. 6, the period of cogging waveform corresponds to the slot pitch. When the groove length is adjusted to be slightly shorter than the slot length, as shown in FIG. 3, the period of cogging waveform corresponds to the approximately apparent slot pitch. However, in order to realize a similar cogging waveform even in the case where the movable part of the linear motor is moved forward or backward, as shown in FIG. 5, the shape of iron core element is always symmetrical with respect to its center line.

Provision of the groove at the end surface of iron core element is performed for the purpose of decreasing the period of the cogging waveform, not increasing a harmonic component of the cogging waveform. The effect of the present invention can be attained by providing the cogging waveform which is an almost periodic function having a small pitch. This is associated with skew of the magnet array of the movable part described below.

The magnet array of the movable part will be described.

Figure 7:
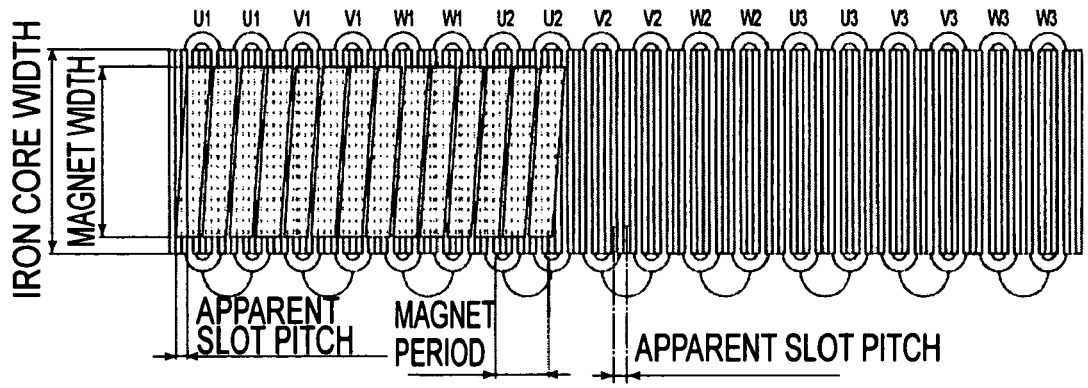
FIG. 7 is a view showing a relationship between a magnet width and an iron core width in the linear motor shown in FIG. 1.

FIG. 7 is a top view showing such a state that the back-yoke is removed from the movable part. As shown in FIG. 7, each magnet constituting the magnet array of the movable part has a parallelogram in shape and is designed so that positions of both ends of the magnet are shifted by the slot pitch. This is one of the features of the present invention. In this embodiment, the magnet is skewed to deviate the positions of its ends from each other by the slot pitch. When a degree of deviation is larger or smaller than the above described deviation, the cogging is increased. Only when the degree of deviation at the positions of both ends of the magnet substantially coincides with the apparent slot pitch, the cogging becomes substantially zero. As another feature of the linear motor of the present invention, a width of the magnet is equal to or slightly smaller than a width of the iron core element.

As described above, in the case where one groove is provided at the iron core element end surface and the magnet array is not skewed, the relationship between the movable part position and the cogging is as shown in FIG. 3. Specifically, the cogging waveform is a periodic function having the approximately apparent slot pitch as a period and include a harmonic component.

Figure 8:
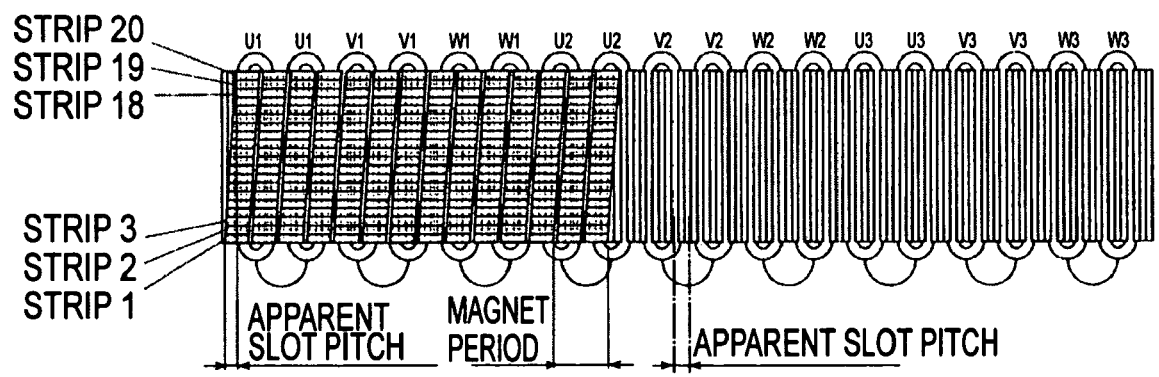
FIG. 8 is a view showing a concept of a movable magnet array (magnet train) in the linear motor shown in FIG. 1.

The magnet 3 of the movable part 20 shown in FIG. 1 can be approximated to a magnet unit which comprises a group of strip-like magnets and has a sufficiently small strip width as shown in FIG. 8. As a result, a cogging waveform of each of the strip-like magnet system (group) is identical to the cogging waveform in the case where the magnet array is not skewed but is only different therefrom in phase. Accordingly, the cogging waveform of the entire movable part is one obtained by shifting the cogging waveform in the case of the magnet array with no skew by a phase (a phase in electric angle having an apparent slot pitch as a period) and combining the resultant cogging waveforms. In FIG. 8, the approximation is made by dividing the magnet 3 shown in FIG. 1 into 20 strip-like magnets (magnet strips).

In this embodiment, the positions of both ends of the magnet are deviated from each other by the apparent slot pitch, so that a phase of a strip 1 in electrical angle having the apparent slot pitch as the period is substantially equal to that of a strip 20. In other words, cogging waveforms of the strip 1 and the strip 20 are substantially identical to each other. With respect to the combining operation of the respective cogging waveforms by shifting the phase little by little, when the phase is shifted little by little from 0 to 360 degrees, the resultant (combined) waveform becomes zero throughout. This is because the phase is added by shifting thereof from 0 to 350 degrees, so that at any position, the original cogging waveform is added by one period. By shifting the magnet by the apparent slot pitch at its both ends as the feature of the present invention, phases of the cogging waveforms of the strip 1 and the strip 20 are substantially identical to each other, so that it becomes possible to combine the respective cogging waveforms by shifting the phases thereof from 0 to 350 degrees little by little according to this embodiment. This is shown in FIGS. 9(*a*) and 9(*b*).

Figure 9:
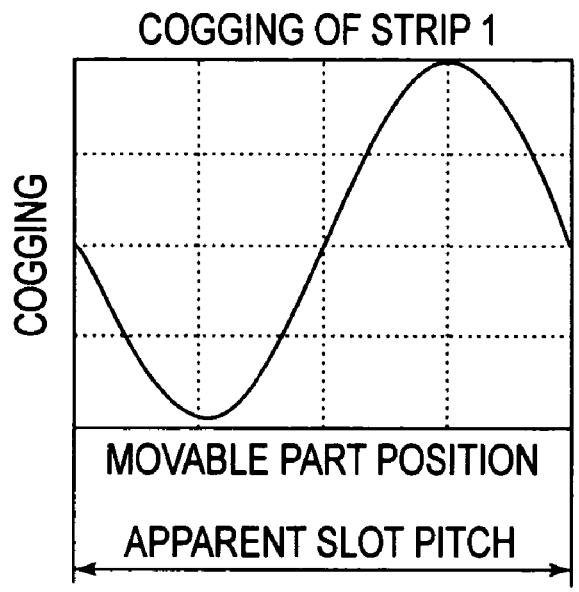
FIGS. 9(a) and 9(b) are views for illustrating cogging in the linear motor shown in FIG. 1.
Figure 9:
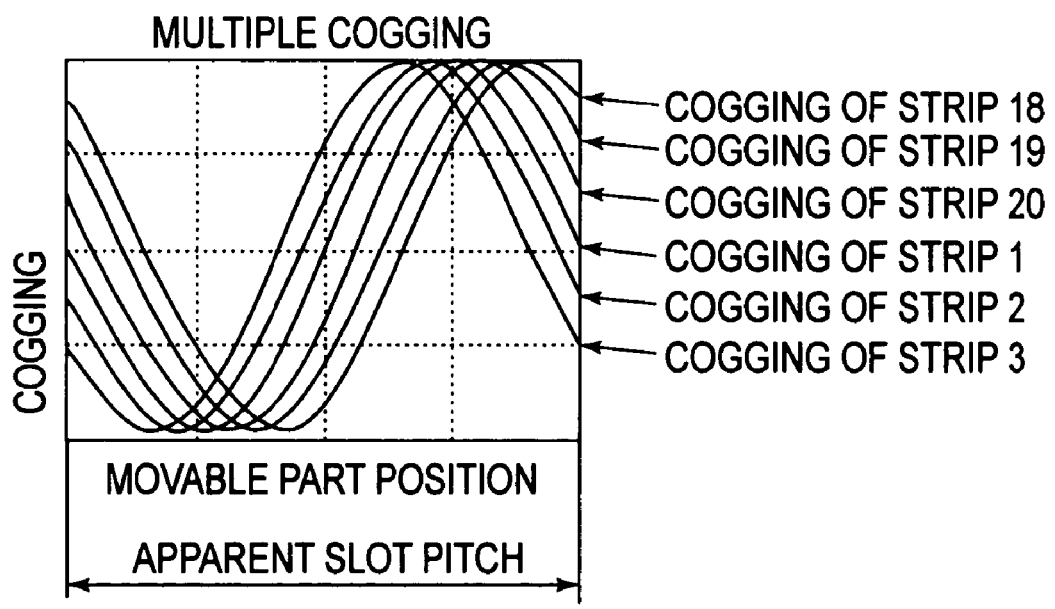

As shown in FIGS. 9(*a*) and 9(*b*), a cogging amplitude of each magnet strip is 1/20 of that shown in FIG. 3. In this state, a width of the strip is actually infinitely small, so that cogging at each position becomes one which is obtained by integrating one period of cogging waveform, thus being zero at any position.

Next, a relationship between a magnet width and a iron core element width will be described.

In the case of the magnet width>the iron core element width, cogging due to an interaction between a magnet portion located outside the iron core element and a magnet portion located close to a side surface of a tooth of the iron core element is present, thus undesirably increasing the resultant cogging.

In the case of the magnet width=the iron core element width, the resultant cogging becomes substantially zero as intended by the present invention. However, there is an assembly error with respect to the magnet and the iron core element, so that the magnet and the coil are actually assembled with deviation even when the magnet and the iron core element are designed to have the same width. As a result, a composition of cogging at a portion where the magnet and the coil overlap each other is deviated from a composition thereof from 0 to 360 degrees to generate cogging. Further, a portion of the magnet protruded from the iron core element generates another cogging by itself. Accordingly, it is not preferable that the magnet width is equal to the iron core element width. Accordingly, it is preferable that the magnet width is designed to be slightly smaller than the iron core element width and a degree of deviation (shifting) at both ends of the magnet coincides with the apparent slot pitch, as described emphatically with reference to FIG. 7. By doing so, when the assembly error is smaller than (iron core element width−magnet width)/2, the magnet is not protruded from the iron core element. Therefore, the resultant cogging can be made substantially zero. According to this method, it is possible to realize zero-cogging in principle even when an original cogging waveform include any harmonic component because the resultant cogging is obtained by integrating one period of the cogging waveform.

Next, the thrust will be described.

Figure 10:
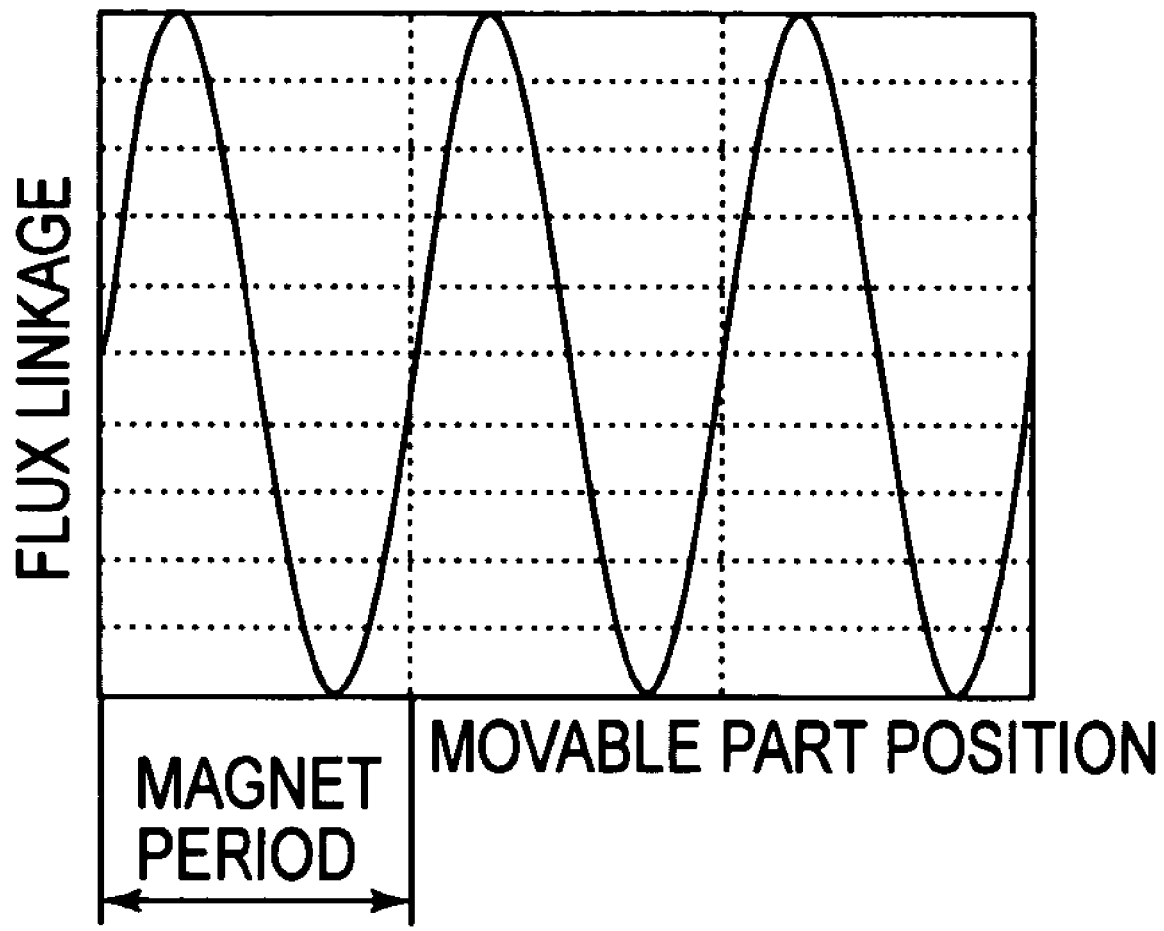
FIGS. 10, 11(a) and 11(b) are views for illustrating flux linkage in the linear motor shown in FIG. 1.

The thrust is proportional to flux linkage of one coil. In the case where the magnet array is not skewed, the flux linkage of one coil becomes an almost sinusoidal wave having a magnetic period as a period as shown in FIG. 10.

Figure 11:
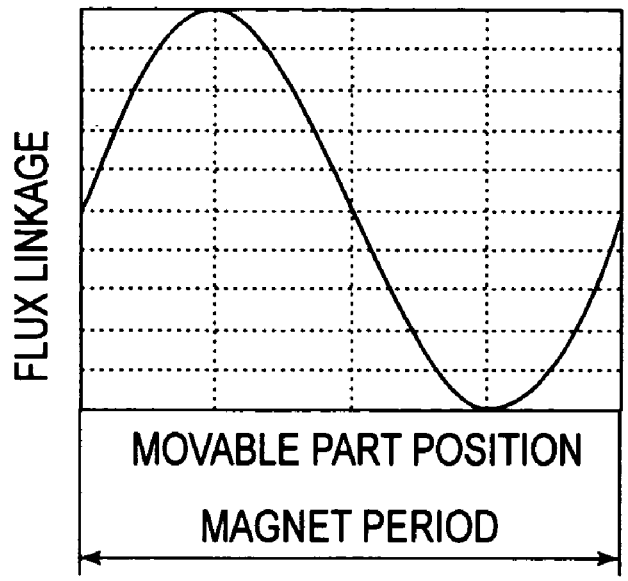
Figure 11:
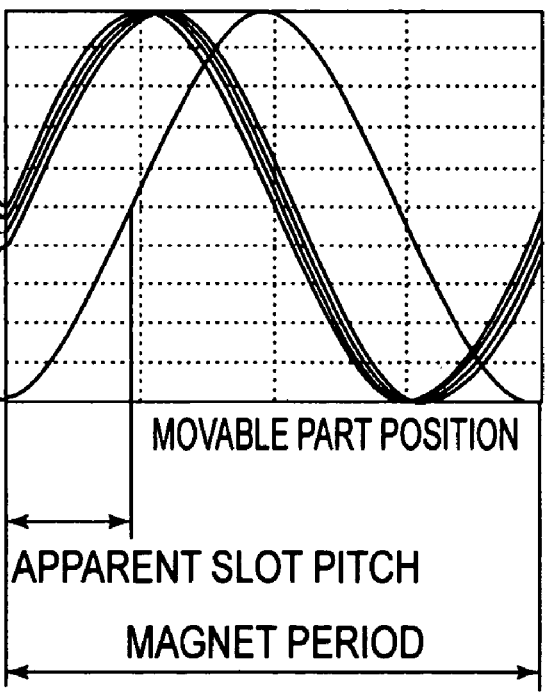

In this embodiment, flux linkage in the case where the magnet array is skewed at both ends thereof by an apparent slot pitch is considered. This is also determined based on composition of strip-like magnet system which is considered with reference to FIG. 8. Flux linkage with respect to one coil by one strip-like magnet is one which is 1/20 of the waveform of flux linkage shown in FIG. 10 and is deviated therefrom in phase. The flux linkage for one oil in this embodiment is obtained by combining flux linkages with respect to the coil by all the strip-like magnets. This is similar to the case of cogging. However, the cogging waveform is the almost periodical function having the apparent slot pitch as a period. On the other hand, the flux linkage waveform is a periodic function having a magnet period as a period. Accordingly, a degree of deviation only by the apparent slot pitch is 360 degrees in electrical angle on the basis of the apparent slot pitch but is not 360 degrees in electrical angle on the basis of the magnet period. This is shown in FIGS. 11(*a*) and 11(*b*). As shown in these figures, the flux linkage waveform is obtained by combining sine waves. FIGS. 11(*a*) and 11(*b*) show that the resultant sine wave provides a phase difference which is smaller than 1/2 of the period. For this reason, the resultant cogging becomes zero. However, the resultant flux linkage leading to the thrust is decreased but does not become zero, thus being retained as a larger value.

More specifically, in the structure including 11 poles, 12 slots and 24 apparent slots, a degree of deviation corresponding to the apparent slot pitch is 180×11/24=82.5 degrees in electrical angle on the basis of the magnet period. Accordingly, assuming that the flux linkage for one coil in the conventional linear motor is a sine wave having an amplitude of 1 (which is actually better approximation with sufficient accuracy), an amplitude of the flux linkage for one coil in the structure of this embodiment is an average of cos θ=+82.5/2 degrees. In other words, the amplitude is obtained by dividing an integral of cos θ values from θ=−82.5/2 degrees to θ=+82.5/2 degrees by 82.5 degrees. This amplitude can be accurately calculated as about 0.92. In short, according to the structure of this embodiment, the cogging becomes substantially zero and the thrust can be retained as 0.92 time that in the case of using the magnet array with no skew.

Incidentally, provision of skew to magnet on a stator side in a movable coil-type linear motor having an iron cone is a general technique. However, the above-described structure of this embodiment is only effective in the movable magnet-type linear motor but is not effective in the movable coil-type linear motor. This is because the periods of the cogging waveform and the flux linkage can be independently designed only in the movable magnet-type linear motor and inevitably coincide with each other in the movable coil-type linear motor.

In the movable coil-type linear motor, the cogging is generated at the period of magnet, so that a degree of deviation at both ends of the magnet is required to correspond to the magnet period when the structure of this embodiment is applied to the movable coil-type linear motor as it is. As a result, the cogging becomes substantially zero with reliability. However, at the same time, the flux linkage is also subjected to averaging, so that it becomes zero at any position. As a result, the movable coil-type linear motor does not function as a motor. In other words, the movable coil-type linear motor having iron core provides a degree of cogging reduction which is identical to a degree of lowering in thrust, so that it cannot be provided with skew even when a large skew is intended to be provided thereto. Accordingly, the skewed magnet in the movable coil-type linear motor fails to prevent cogging, thus merely removing the harmonic component of cogging with penalty of thrust.

In this embodiment, the groove is provided at the iron core element end surface to increase the number of apparent slots, thus shortening the period of cogging waveform in order to reduce an amount of skew (in electrical angle on the basis of the magnet period) of the magnet array of the stator. The cogging can be reduced to substantially zero by deviating both end positions of the magnet by the apparent pitch, so that the amount of skew is determined by the apparent slot pitch. By decreasing the apparent slot pitch, it is possible to realize a small amount of skew of the magnet and a small lowering in flux linkage due to the skew. In this embodiment, the end surface of the armature is provided of one groove to provide the number of apparent slots being two times the number of actual slots, thus decreasing the cogging waveform period to ½ thereof. However, in the present invention, the number of groove is not limited to one. The larger number of grooves can effectively shortening the period of cogging waveform, thus permitting a small amount of skew of the magnet array and a small lowering in flux linkage due to the skew. The small lowering in flux linkage leads to a small amount of heat generation when the linear motor generates thrust, thus suppressing a deterioration in heat generation characteristic of the linear motor.

Figure 12:
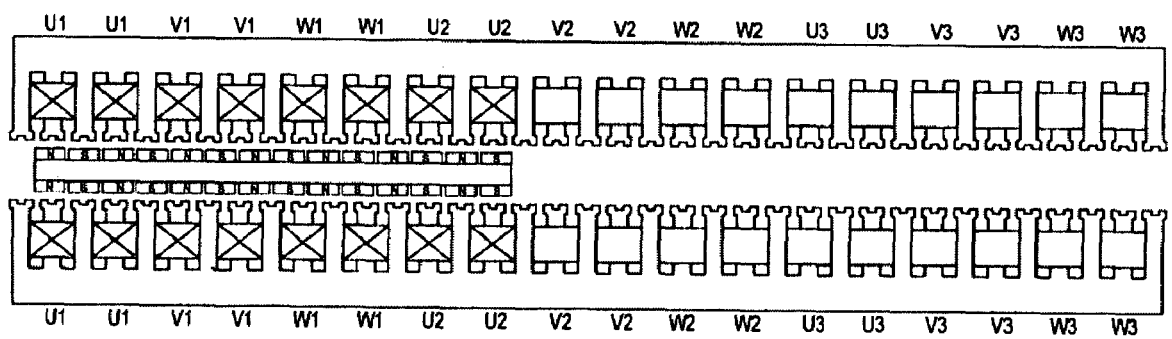
FIG. 12 is a view showing a modified embodiment of the linear motor shown in FIG. 1.

It is possible to use such a structure that a movable part is interposed between stators as shown in FIG. 12. In this case, it is preferable that upper magnets and lower magnets are arranged so that they are skewed to provide an "x" character relationship (i.e., alternating S-poles and N-poles of the upper magnets are opposite from alternating N-poles and S-poles of the lower magnets, respectively), thus preventing moment from acting on the stators.

Further, in this embodiment, the linear motor has the structure including 11 poles, 12 slots and 24 apparent slots but the present invention is applicable to any combinations of poles and slots. In order to produce large thrust when the cogging is reduced to zero, a difference in dimension between the apparent slot pitch and the magnet period may preferably be large.

Second Embodiments

Figure 13:
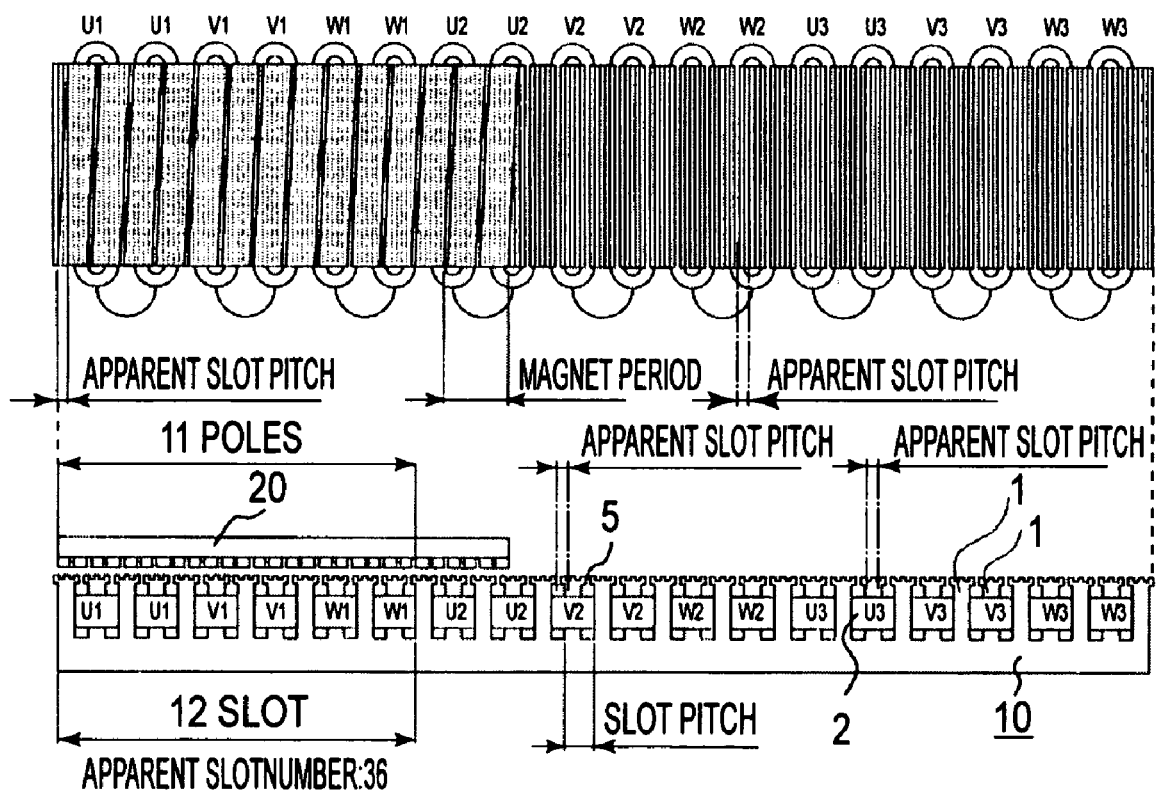
FIG. 13 is a view showing a structure of a linear motor according to a Second Embodiment of the present invention.

FIG. 13 shows a structure of a movable magnet-type linear motor according to this embodiment of the present invention.

The linear motor has the same structure and basic design as those in First Embodiment except that the shape of iron core element and the arrangement of magnet array are changed.

First of all, the structure of iron core elements of the stator in the linear motor shown in FIGS. 1 and 2 will be described.

Each of the iron core elements 1 arranged in parallel at a certain spacing is provided with grooves 6 disposed at its end surface facing the magnet array of the movable part 20 so that the grooves 6 are perpendicular to the moving direction of the movable part 20. By doing so, it is possible to reduce a period of cogging as a feature of the linear motor according to the present invention. In this embodiment, two grooves 6 are provided at a central portion of an end surface of one iron core element 1.

In an actual linear motor, the number of grooves 6 provided at the end surface of iron core element may appropriately determined but the positions of the grooves are determined such that a spacing between adjacent slot and groove is approximately equal to a spacing between adjacent grooves. As described above, a pitch of adjacent slot and groove of the plurality of slots and grooves arranged at an appropriately identical spacing is referred to as the "apparent slot pitch (slot spacing)". In order to provide a space in which a groove is formed at the iron core element end surface, the dimension of the iron core element in the moving direction is determined such that a portion of the end surface where the groove is provided is longer than a portion where the coil is wound.

By providing such a structure, when the iron core elements of the stator 10 are viewed from the magnet array of the movable part 20, the number of apparent slots is made appear to be larger than the number of actual slots. In this embodiment, with respect to 11 poles of the magnets of the movable part, the number of apparent slots of the stator is 36. Ordinarily, different from a rotation-type motor in the movable magnet-type linear motor, the movable part has a formed end and a rear end in the moving direction, so that cogging occurs as an almost periodic function including a high frequency wave have a slot pitch (of the slot 5) as a period by the effect of these ends when the movable part is moved.

Figure 14:
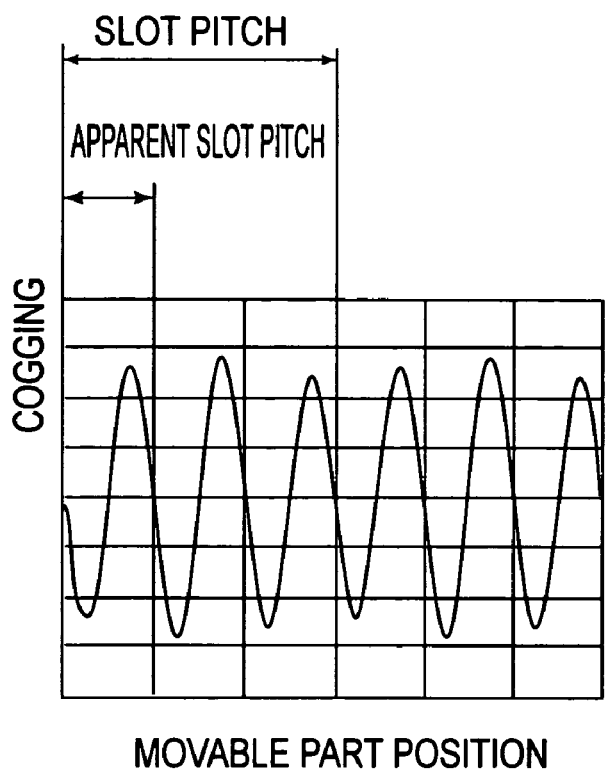
FIGS. 14(a) and 14(b) are views for illustrating cogging in the linear motor shown in FIG. 13.
Figure 14:
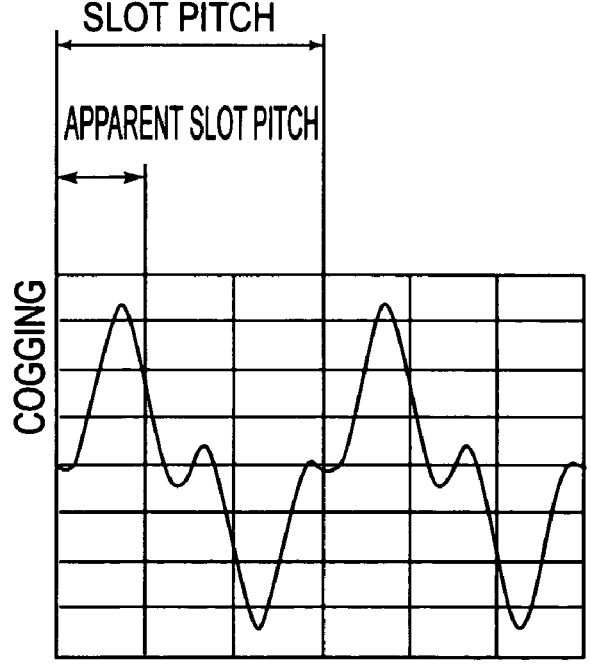

FIG. 14(a) shows a relationship between a position of movable part and cogging. As shown in FIG. 4(a), a cogging waveform of a movable magnet-type linear motor with no groove (at an iron core element end surface) is a periodic function having a slot pitch as a period. On the other hand, as shown in FIG. 14(a), the cogging were form in the case where the grooves are provided is a periodic function having an approximately apparent slot pitch as a period.

By providing the grooves at the iron core element end surface, it is possible to decrease the period of the cogging waveform to the approximately apparent pitch. However, in order to actually equalize the cogging waveform period with the apparent slot pitch, it is necessary to effect fine adjustment of shape parameters of iron core element and surface. This is because a magnitude of permeance from the slot to the magnet is different from a magnitude of permeance from the groove to the magnet. A cogging waveform in the case where no adjustment is made is shown in FIG. 14(b), wherein the cogging occurs as a periodic function including a harmonic component having a slot pitch was a period.

In this embodiment, the shape of iron core element end surface is move complicated compared with that in First Embodiment, so that the number of shape parameters is increased. In addition to adjustment of the slot length and the groove length described in First Embodiment, adjustment of a groove position at the iron core element end surface is also performed in this embodiment. The groove position is, as shown in FIGS. 15(a), (b) and (c), determined such that two grooves are arranged from the center line of the iron core element in the moving direction on the basis of positions of groove and slot arranged at the apparent slot pitch. In this embodiment, when the groove length is adjusted to be slightly shorter than the slot length and the grooves are disposed so that they are slightly apart from the center line of iron core element on the basis of reference as shown in FIG. 14(a), the period of cogging waveform corresponds to the approximately apparent slot pitch. However, in order to realize a similar cogging waveform even in the case where the movable part of the linear motor is moved forward or backward, the shape of iron core element is always symmetrical with respect to its center line.

Provision of the grooves at the end surface of iron core element is performed for the purpose of decreasing the period of the cogging waveform, not increasing a harmonic component of the cogging waveform. The effect of the present invention can be attained by providing the cogging waveform which is an almost periodic function having a small pitch. This is associated with skew of the magnet array of the movable part described below.

Figure 16:
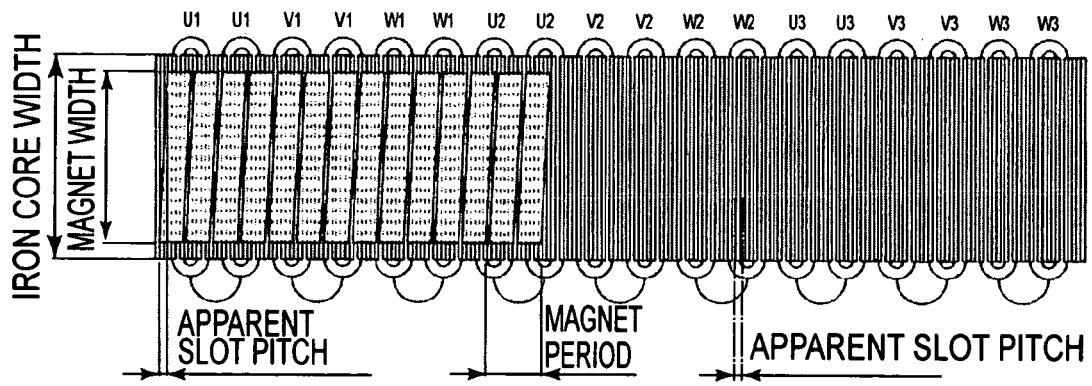
FIG. 16 is a view showing a relationship between a magnet width and an iron core width in the linear motor shown in FIG. 13.

The magnet array of the movable part will be described. FIG. 16 is a top view showing such a state that the back-yoke is removed from the movable part. As shown in FIG. 16, each magnet constituting the magnet array of the movable part has a parallelogram in shape and is designed so that positions of both ends of the magnet are shifted by the slot pitch. This is one of the features of the present invention. In this embodiment, the magnet is skewed to deviate the positions of its ends from each other by the slot pitch. When a degree of deviation is larger or smaller than the above described deviation, the cogging is increased. Only when the degree of deviation at the positions of both ends of the magnet substantially coincides with the apparent slot pitch, the cogging becomes substantially zero. As another feature of the linear motor of the present invention, a width of the magnet is equal to or slightly smaller than a width of the iron core element.

Figure 17:
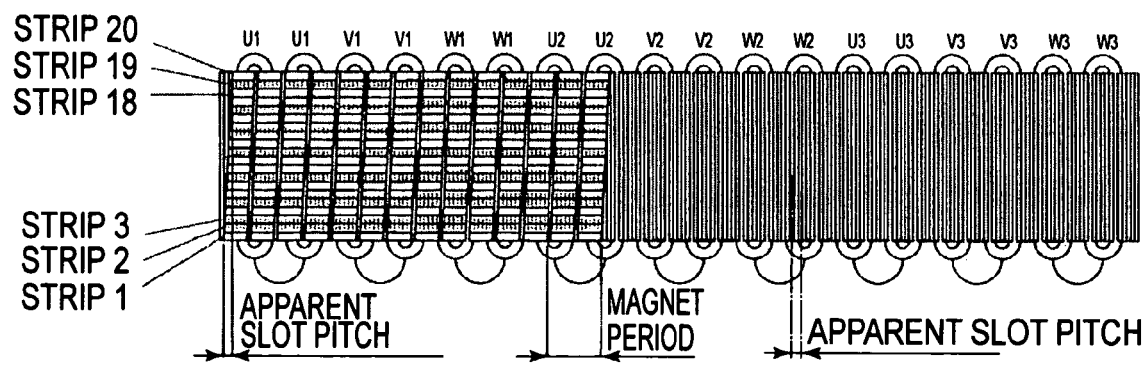
FIG. 17 is a view showing a concept of a movable magnet array (magnet train) in the linear motor shown in FIG. 13.

The structure of the movable part in this embodiment can be approximated to a magnet unit which comprises a group of strip-like magnets and has a sufficiently small strip width as shown in FIG. 17. As a result, a cogging waveform of one strip-like magnet system (group) is identical to the cogging waveform in the case where the magnet array is not skewed but is only different therefrom in phase. Accordingly, the cogging waveform of the entire movable part is one obtained by shifting the cogging waveform in the case of the magnet array with no skew by a phase (a phase in electric angle having an apparent slot pitch as a period) and combining the resultant cogging waveforms. In FIG. 17, the strip-like magnet system including 20 strip-like magnets (magnet strips) is shown. In this embodiment, the positions of both ends of the magnet are deviated from each other by the apparent slot pitch, so that a phase of a strip 1 in electrical angle having the apparent slot pitch as the period is substantially equal to that of a strip 20. In other words, cogging waveforms of the strip 1 and the strip 20 are substantially identical to each other. With respect to the combining operation of the respective cogging waveforms by shifting the phase little by little, when the phase is shifted little by little from 0 to 360 degrees, the resultant (combined) waveform becomes zero throughout. This is because the phase is added by shifting thereof from 0 to 350 degrees, so that at any position, the original cogging waveform is added by one period. By shifting the magnet by the apparent slot pitch at its both ends as the feature of the present invention, phases of the cogging waveforms of the strip 1 and the strip 20 are substantially identical to each other, so that it becomes possible to combine the respective cogging waveforms by shifting the phases thereof from 0 to 350 degrees little by little according to this embodiment. In an actual state, a width of the strip is infinitely small, so that cogging at each position becomes one which is obtained by integrating one period of cogging waveform, thus being zero at any position.

Next, a relationship between a magnet width and a iron core element width will be described.

In the case of the magnet width>the iron core element width, cogging due to an interaction between a magnet portion located outside the iron core element and a magnet portion located close to a side surface of a tooth of the iron core element is present, thus undesirably increasing the resultant cogging.

In the case of the magnet width=the iron core element width, the resultant cogging becomes substantially zero as intended by the present invention. However, there is an assembly error with respect to the magnet and the iron core element, so that the magnet and the coil are actually assembled with deviation even when the magnet and the iron core element are designed to have the same width. As a result, a composition of cogging at a portion where the magnet and the coil overlap each other is deviated from a composition thereof from 0 to 360 degrees to generate cogging. Further, a portion of the magnet protruded from the iron core element generates another cogging by itself. Accordingly, it is not preferable that the magnet width is equal to the iron core element width. Accordingly, it is preferable that the magnet width is designed to be slightly smaller than the iron core element width and a degree of deviation (shifting) at both ends of the magnet coincides with the apparent slot pitch, as described emphatically with reference to FIG. 16. By doing so, when the assembly error is smaller than (iron core element width-magnet width)/2, the magnet is not protruded from the iron core element. Therefore, the resultant cogging can be made substantially zero. According to this method, it is possible to realize zero-cogging in principle even when an original cogging waveform include any harmonic component because the resultant cogging is obtained by integrating one period of the cogging waveform.

Next, the thrust will be described.

The thrust is proportional to flux linkage of one coil. In the case where the magnet array is not skewed, the flux linkage of one coil becomes an almost sinusoidal wave having a magnetic period as a period as shown in FIG. 10.

Figure 18:
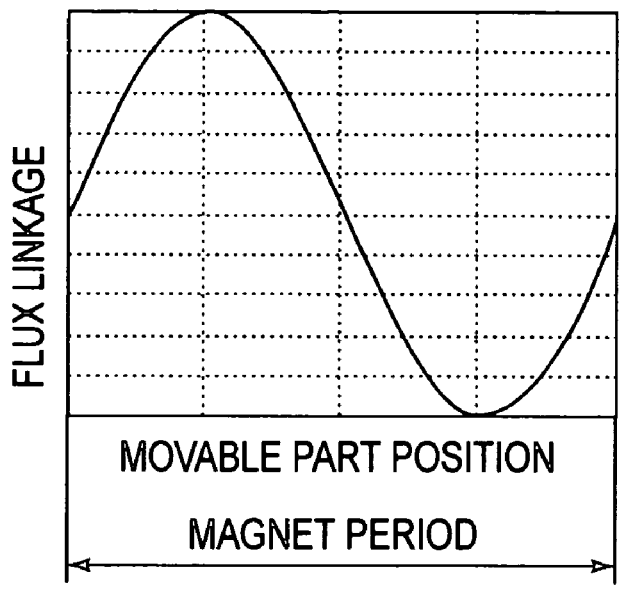
FIGS. 18(a) and 18(b) are views for illustrating flux linkage in the linear motor shown in FIG. 13.
Figure 18:
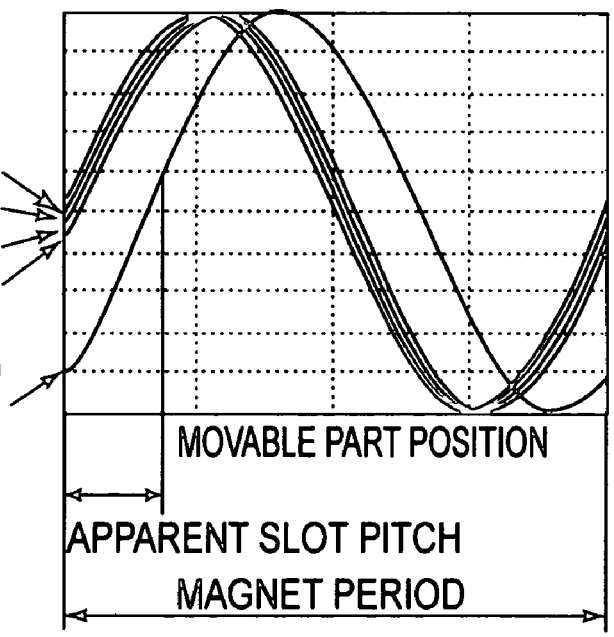

In this embodiment, flux linkage in the case where the magnet array is skewed at both ends thereof by an apparent slot pitch is considered. This is also determined based on composition of strip-like magnet system which is considered with reference to FIG. 17. Flux linkage with respect to one coil by one strip-like magnet is one which is ¹⁄₂₀ of the waveform of flux linkage shown in FIG. 10 and is deviated therefrom in phase. The flux linkage for one oil in this embodiment is obtained by combining flux linkages with respect to the coil by all the strip-like magnets. This is similar to the case of cogging. However, the cogging waveform is the almost periodical function having the apparent slot pitch as a period. On the other hand, the flux linkage waveform is a periodic function having a magnet period as a period. Accordingly, a degree of deviation only by the apparent slot pitch is 360 degrees in electrical angle on the basis of the apparent slot pitch but is not 360 degrees in electrical angle on the basis of the magnet period. This is shown in FIGS. 18(a) and 18(b). As shown in these figures, the flux linkage waveform is obtained by combining sine waves. FIGS. 18(a) and 18(b) show that the resultant sine wave provides a phase difference which is smaller than ½ of the period. For this reason, the resultant cogging becomes zero. However, the resultant flux linkage leading to the thrust is decreased but does not become zero, thus being retained as a larger value.

More specifically, in the structure including 11 poles, 12 slots and 36 apparent slots, a degree of deviation corresponding to the apparent slot pitch is 180×11/36=55 degrees in electrical angle on the basis of the magnet period. Accordingly, assuming that the flux linkage for one coil in the conventional linear motor is a sine wave having an amplitude of 1 (which is actually better approximation with sufficient accuracy), an amplitude of the flux linkage for one coil in the structure of this embodiment is an average of cos θ=+55/2 degrees. In other words, the amplitude is obtained by dividing an integral of cos θ values from θ=−55/2 degrees to θ=+55/2 degrees by 55 degrees. This amplitude can be accurately calculated as about 0.96. In short, according to the structure of this embodiment, the cogging becomes substantially zero and the thrust can be retained as 0.96 time that in the case of using the magnet array with no skew.

In this embodiment, the grooves are provided at the iron core element end surface to increase the number of apparent slots, thus shortening the period of cogging waveform in order to reduce an amount of skew (in electrical angle on the basis of the magnet period) of the magnet array of the stator. The cogging can be reduced to substantially zero by deviating both end positions of the magnet by the apparent pitch, so that the amount of skew is determined by the apparent slot pitch. By decreasing the apparent slot pitch, it is possible to realize a small amount of skew of the magnet and a small lowering in flux linkage due to the skew. In this embodiment, the end surface of the armature is provided of two grooves to provide the number of apparent slots being two times the number of actual slots, thus decreasing the cogging waveform period to ⅓ thereof. However, in the present invention, the number of groove is not limited to one. The larger number of grooves can effectively shortening the period of cogging waveform, thus permitting a small amount of skew of the magnet array and a small lowering in flux linkage due to the skew. The small lowering in flux linkage leads to a small amount of heat generation when the linear motor generates thrust, thus suppressing a deterioration in heat generation characteristic of the linear motor.

Figure 19:
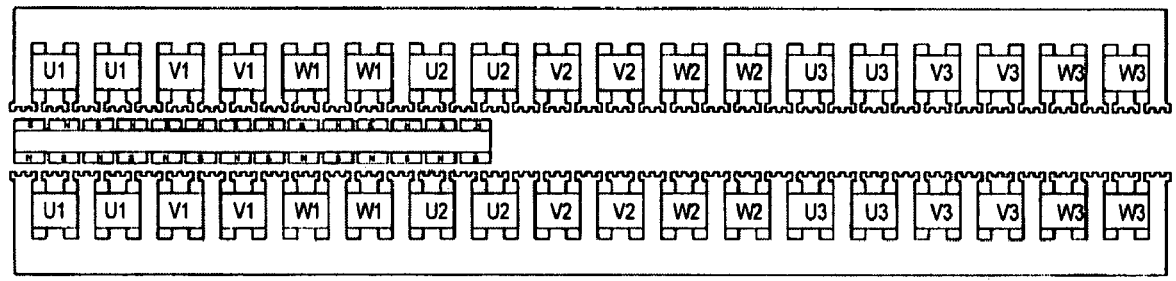
FIG. 19 is a view showing a modified embodiment of the linear motor shown in FIG. 13.

It is possible to use such a structure that a movable part is interposed between stators as shown in FIG. 19. In this case, it is preferable that upper magnets and lower magnets are arranged so that they are skewed to provide an "x" character relationship (i.e., alternating S-poles and N-poles of the upper magnets are opposite from alternating N-poles and S-poles of the lower magnets, respectively), thus preventing moment from acting on the stators.

Further, in this embodiment, the linear motor has the structure including 11 poles, 12 slots and 36 apparent slots but the present invention is applicable to any combinations of poles and slots. In order to produce large thrust when the cogging is reduced to zero, a difference in dimension between the apparent slot pitch and the magnet period may preferably be large.

In the above described embodiments, the grooves are provided as the pseudo-slots. However, in the present invention, the pseudo-slots may be those other than the grooves so long as they have such a structure that a magnetic resistance varies between the slots or are formed of a material capable of causing such a magnetic resistance variation. For example, after the grooves are provided, a diamagnetic material or a non-magnetic material, such as aluminum may be filled in the grooves.

Further, in the embodiments described above, the magnet array is skewed by the apparent slot pitch but a degree of skew may appropriately be increased of skew may be experimentally determined while keeping a balance between the cogging-reducing effect and the degree of lowering in flux linkage.

Further, in the above described embodiments, the iron core element, i.e., the slot is disposed in a direction perpendicular to the moving direction of the movable part but only the iron core element or both of the iron core element and the magnet may be skewed in the direction perpendicular to the moving direction of the movable part.

Figure 20:
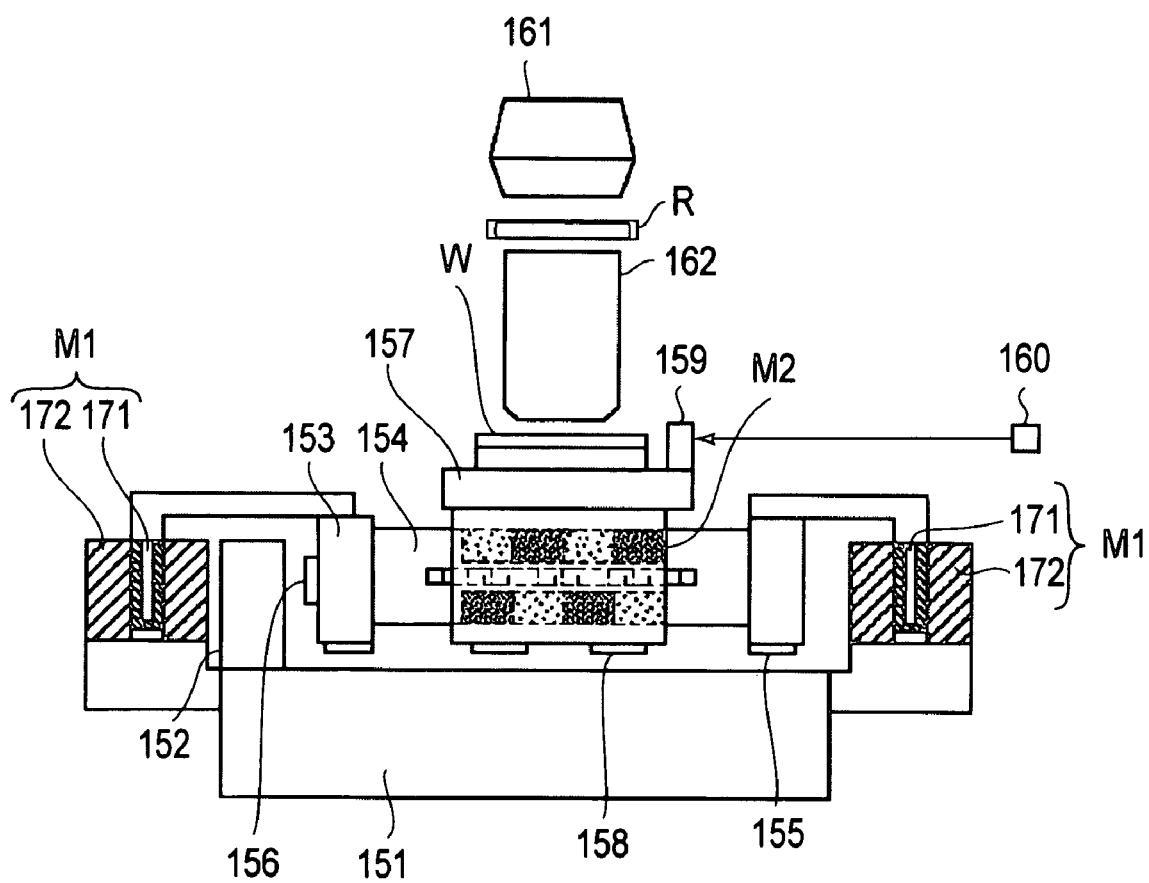
FIG. 20 is a view showing an embodiment in which a wafer stage is driven by the linear motor according to the present invention in an exposure apparatus for semiconductor device manufacture.

FIG. 20 shows an exposure apparatus for semiconductor device manufacture in which a wafer stage is driven by the above described linear motor.

The exposure apparatus shown in FIG. 20 is utilized for manufacturing a semiconductor device, such as a semiconductor integrated circuit; a micromachine; a device provided with a fine pattern; etc. The exposure apparatus forms a desired pattern on a substrate by irradiating a semiconductor wafer W as the substrate with exposure light (such as visible light, ultraviolet light, EUV light, X ray, electron beam, or charged particle beam) as exposure energy from a projection lens 162 (such as a refractive lens, a reflection lens, a catadioptric lens system, a charged particle lens) as a projection system through a reticle R as an original.

The exposure apparatus includes a guide 152 and a linear motor stator 172 fixedly disposed on a surface plate 151. Similar to the above described embodiments, the linear motor stator 172 includes a multi-phase magnet coil and a linear motor movable part 171 include a group of permanent magnets. The linear motor movable part 171 is connected, as a movable portion 153, to a movable guide 154 as a stage, and the movable guide 154 is moved in a direction perpendicular to the drawing by driving linear motors Ml. The movable part 153 is supported by a hydrostatic bearing 155 above an upper surface of the surface plate 151 and supported by a hydrostatic bearing 156 along a side surface of the guide 152.

A moving stage 157 as a stage disposed to surround the movable guide 154 is supported by a hydrostatic bearing 158. The moving stage 157 is driven by a linear motor M2 similar to that described above along the movable guide 154 in a left and right direction in the drawing. Movement of the moving stage 157 is measured by a mirror 159 fixedly disposed on the moving stage 157 and an interferometer 160.

The wafer W as the substrate is held on a chuck mounted on the moving stage 157, and a pattern of the reticle R as the original is transferred with reduction in size onto respective areas of the wafer W according to step-and-repeat scanning or step and scanning.

Next, a manufacturing process (method) of a semiconductor device utilizing the above described exposure apparatus will be described.

Figure 21:
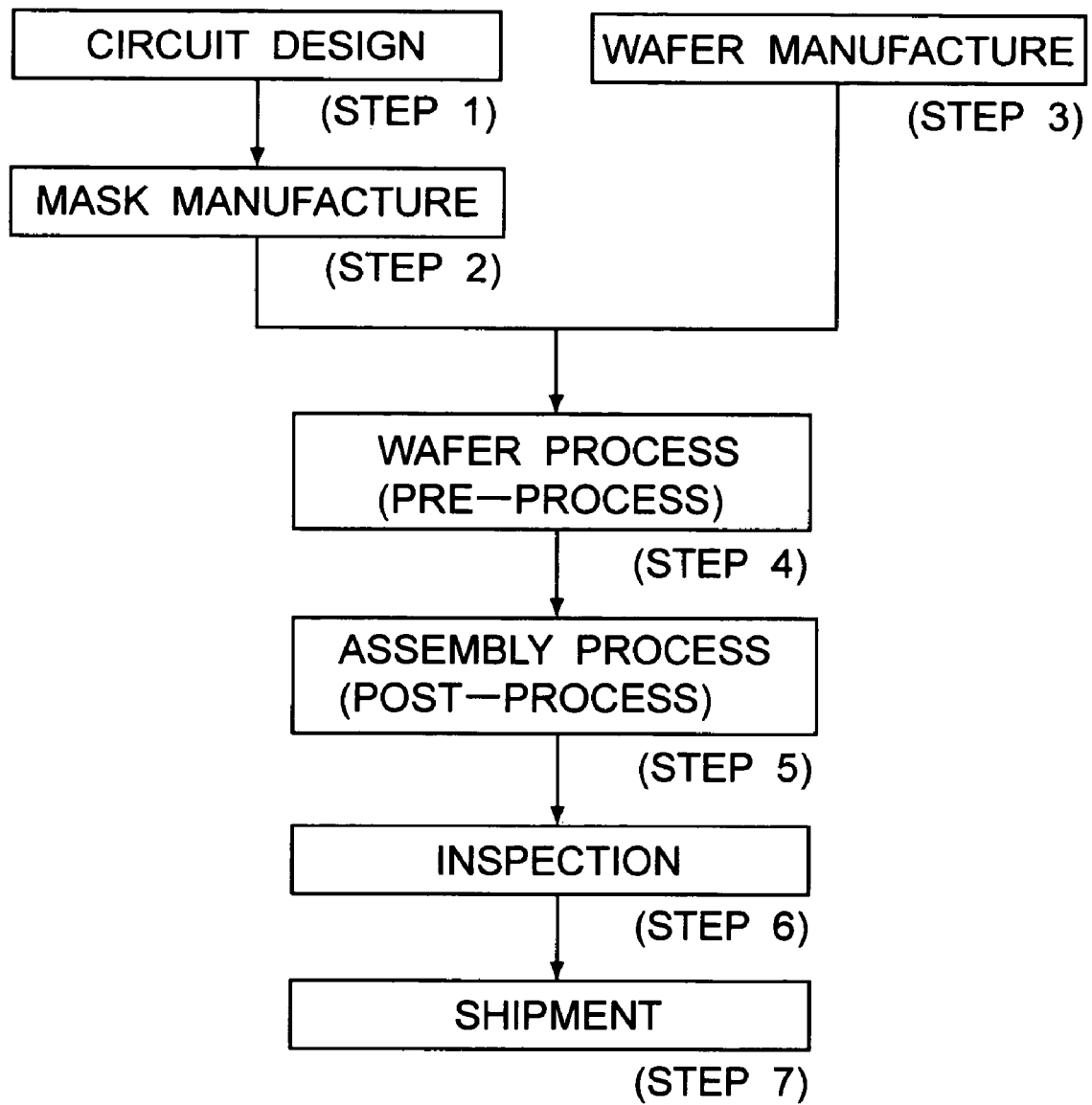
FIG. 21 is a flow chart showing a general manufacturing process of a semiconductor device.

FIG. 21 shows a flow chart of an entire manufacture process of a semiconductor device.

In Step 1 (circuit design), circuit pattern designing of the semiconductor device is performed. In Step 2 (mask manufacture), a mask provided with the designed circuit pattern is manufactured. On the other hand, in Step 3 (wafer manufacture), a wafer is manufactured by use of a material such as silicon. Step 4 (wafer process) is referred to as a pre step in which the above prepared mask and wafer are used to form an actual circuit on the wafer through lithography. A subsequent Step 5 (fabrication) is referred to as a post step in which the circuit formed wafer is fabricated in a semiconductor chip, and includes an assembly step (dicing and bonding), a packaging step (chip sealing), etc. In Step 6 (inspection), the semiconductor device fabricated in Step 5 is subjected to inspection such as operation check, durability test, etc. Through the steps described above, the semiconductor device is finished and then is shipped (Step 7).

Figure 22:
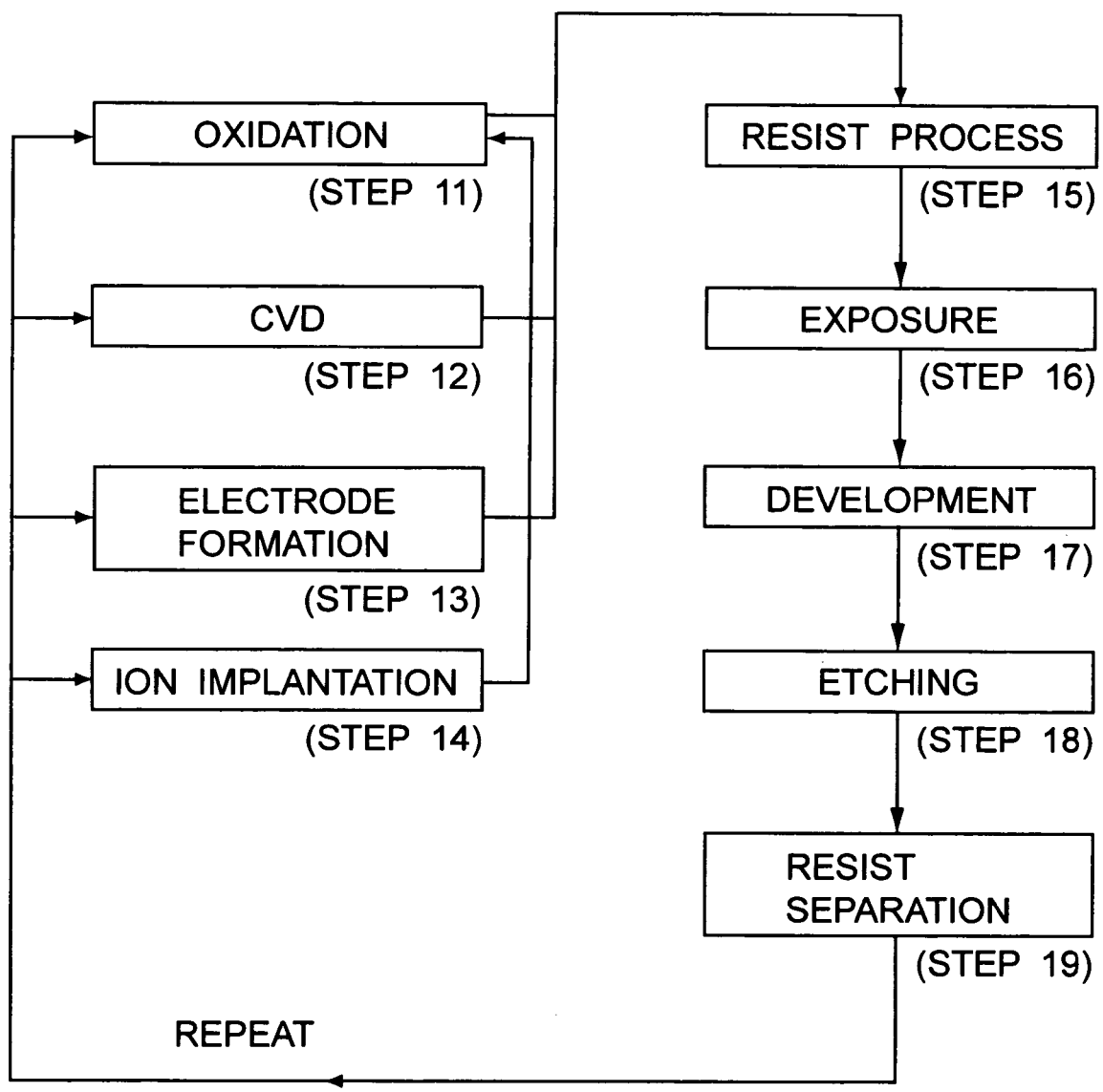
FIG. 22 is a flow chart showing a detailed procedure of wafer process shown in FIG. 21.
Figure 23:
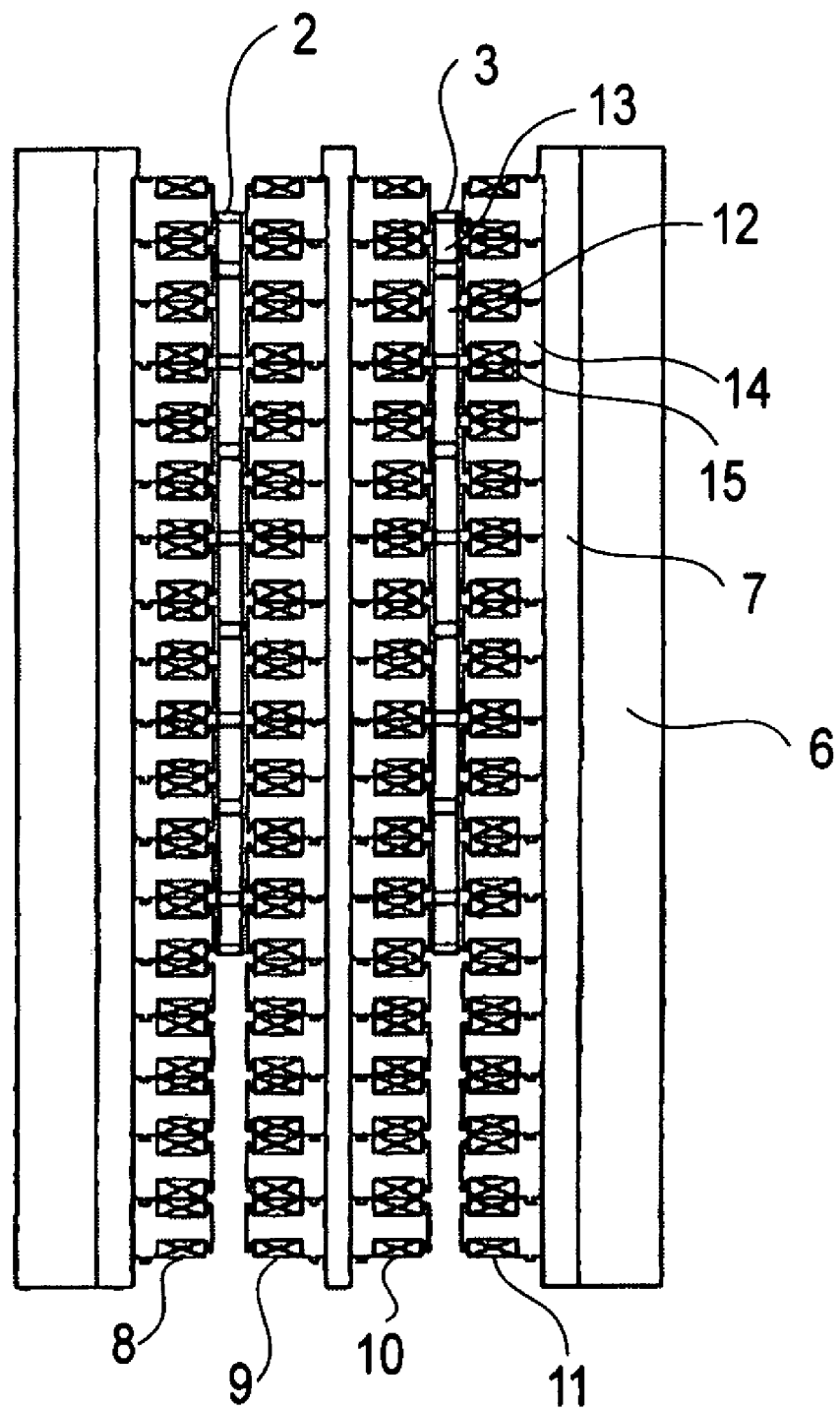
FIG. 23 is a view showing a structure of a conventional linear motor.

FIG. 22 shows a flow chart of a detailed wafer step (Step 3 in FIG. 21).

In Step 11 (oxidation), the surface of wafer is oxidized. In Step 12 (CVD), an insulating film is formed on the wafer surface through CVD. In Step 13 (electrode formation), an electrode is formed on the wafer by (vacuum) vapor deposition. In Step 14 (ion implantation), ion is implanted in the wafer. In Step 15 (resist treatment), a photosensitive agent is applied onto the wafer. In Step 16 (exposure), the circuit pattern of the mask is transferred onto the wafer by pattern exposure through the above described exposure apparatus.

In Step 17 (development), the exposed wafer is subjected to development. In Step 18 (etching) a portion other than the developed resist image is removed. In Step 19 (resist removal), the unnecessary resist after completion of the etching is removed. These steps are repetitively performed to form a multiple circuit pattern on the wafer.

While the invention has been described with reference to the structures disclosed herein, it is not confined to the details set forth and this application is intended to cover such modifications or changes as may come within the purposes of the improvements or the scope of the following claims.

This application claims priority from Japanese Patent Application No. 388507/2003 filed Nov. 18, 2003, which is hereby incorporated by reference.

What is claimed is:

1. A linear motor, comprising:
   a stator having a plurality of iron core elements arranged through slots at a certain slot pitch, and
   a movable part having a magnet which is movable in an arrangement direction of the iron core elements,
   wherein each of the iron core elements has a plurality of grooves at its end surface,
   wherein the magnet is relatively skewed with respect to the iron core elements by an apparent slot pitch including a pseudo-slot, and
   wherein a distance between two of said plurality of grooves is larger than the apparent slot pitch.

2. A motor according to claim 1, wherein the pseudo-slot is dispersed at an end surface of an iron core element facing the magnet and causes a change in magnetic resistance in the arrangement direction.

3. A motor according to claim 1, wherein the grooves have a length shorter than a length of the slots in the arrangement direction.

4. A motor according to claim 1, wherein the slots and the pseudo-slot are disposed perpendicular to the arrangement direction.

5. A motor according to claim 1, wherein the magnet has a polarity inversion pitch at a surface opposite to the iron core element, the polarity inversion pitch and the slot pitch providing a ratio therebetween which creates an odd-even relationship.

6. A motor according to claim 1, wherein the polarity inversion pitch of the magnet is longer than the slot pitch.

7. An exposure apparatus, comprising:
   a projection optical system for projecting an image onto a substrate, and
   a stage for mounting the substrate thereon,
   wherein the stage is positionally aligned with the projection optical system by use of a linear motor according to claim 1.

8. A device manufacturing method, comprising:
   a step of transferring a pattern onto a substrate, onto which a photosensitive agent is applied, by an exposure apparatus comprised of:
   a projection optical system for projecting an image onto a substrate, and
   a stage for mounting the substrate thereon, wherein the stage is positionally aligned with said projection optical system by use of a linear motor comprising:
   a stator having a plurality of iron core elements arranged through slots at a certain slot pitch, and
   a movable part having a magnet which is movable in an arrangement direction of the iron core elements,
   wherein each of the iron core elements has a plurality of grooves at its end surface,
   wherein the magnet is relatively skewed with respect to the iron core elements by an apparent slot pitch including a pseudo-slot, and
   wherein a distance between two of said plurality of grooves is larger than the apparent slot pitch, and
   a step of developing the photosensitive agent on the substrate.

* * * * *

UNITED STATES PATENT AND TRADEMARK OFFICE
CERTIFICATE OF CORRECTION

| | | |
|---|---|---|
| PATENT NO. | : 7,362,013 B2 | Page 1 of 2 |
| APPLICATION NO. | : 10/987028 | |
| DATED | : April 22, 2008 | |
| INVENTOR(S) | : Shinji Uchida | |

It is certified that error appears in the above-identified patent and that said Letters Patent is hereby corrected as shown below:

ON THE TITLE PAGE ITEM [56] REFERENCES CITED:

FOREIGN PATENT DOCUMENTS, "EP   1322027  A1   *   6/2003" should read --EP   1 322 027  A1   *   6/2003--.

Figure 4:
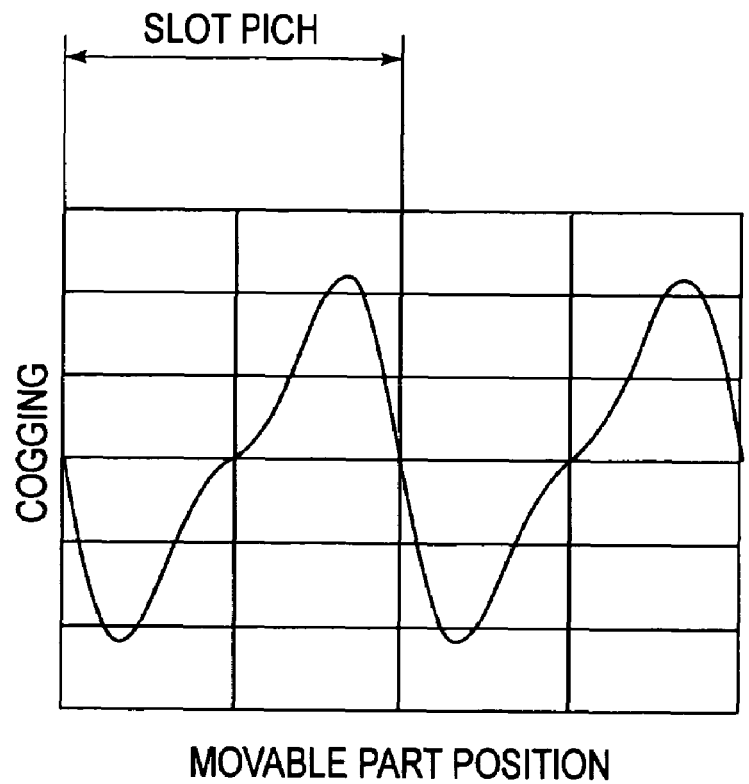
FIGS. 4(a) and 4(b) are views for illustrating cogging in the case where the linear motor shown in FIG. 1 is not provided with a groove.
Figure 4:
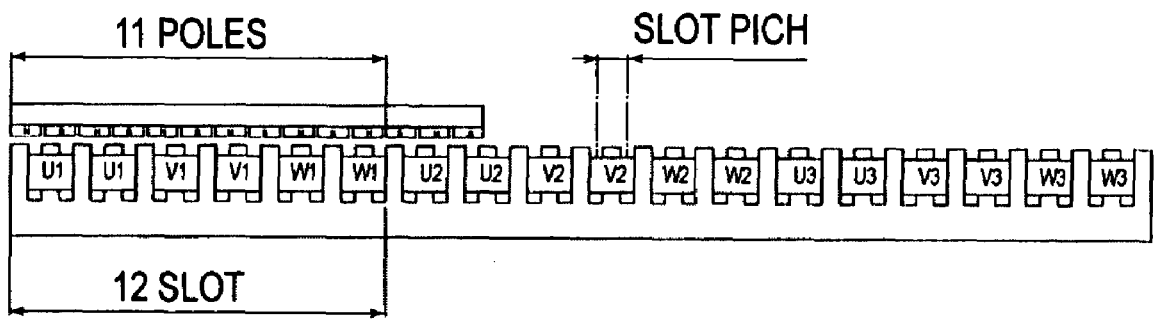

SHEET 4:

FIG. 4, "PICH" (both occurrences) should read --PITCH--.

SHEET 5:

FIG. 5, "GLOOVE" should read --GROOVE--.

Figure 15:
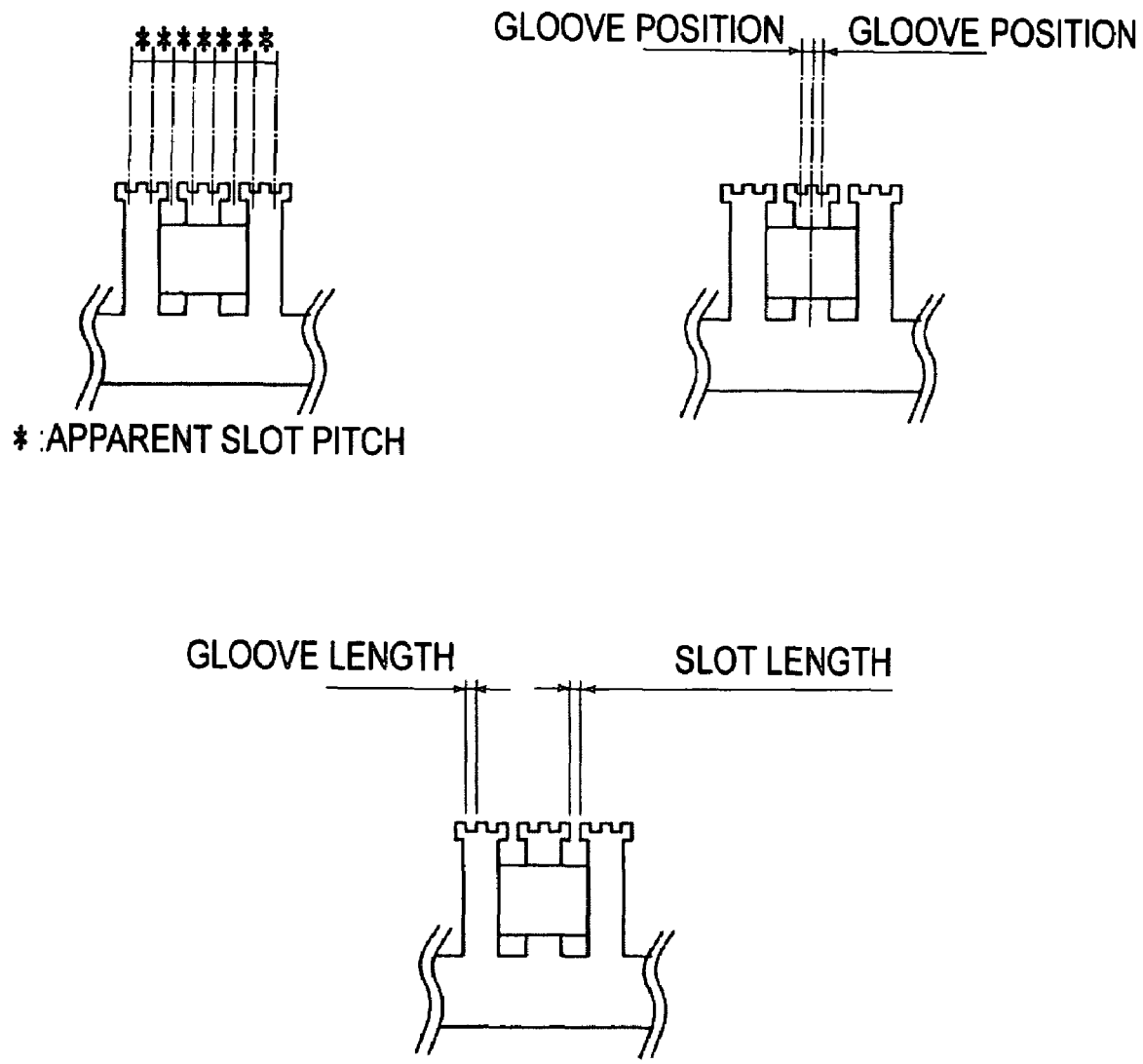
FIG. 15 is an explanatory view for a shape of an armature (iron) core in the linear motor shown in FIG. 13.

SHEET 13:

FIG. 15, "GLOOVE" (three occurrences) should read --GROOVE--.

COLUMN 4:

Line 54, "phase oils." should read --phase coils.--.

COLUMN 5:

Line 60, "were form" should read --waveform--.

COLUMN 8:

Line 8, "one oil" should read --one coil--.
Line 45, "iron cone" should read --iron core--.

UNITED STATES PATENT AND TRADEMARK OFFICE
CERTIFICATE OF CORRECTION

PATENT NO. : 7,362,013 B2
APPLICATION NO. : 10/987028
DATED : April 22, 2008
INVENTOR(S) : Shinji Uchida It is certified that error appears in the above-identified patent and that said Letters Patent is hereby corrected as shown below:

COLUMN 9:

Line 20, "shortening" should read --shorten--.
Line 34, "moment" should read --movement--.
Line 65, "determined" should read --be determined--.

COLUMN 10:

Line 28, "were form" should read --waveform--.

COLUMN 12:

Line 38, "one oil" should read --one coil--.

Signed and Sealed this

Third Day of February, 2009

JOHN DOLL
*Acting Director of the United States Patent and Trademark Office*